(12) United States Patent
Ichikawa

(10) Patent No.: US 7,235,134 B2
(45) Date of Patent: Jun. 26, 2007

(54) COATING DEVICE, AND COATING METHOD USING SAID DEVICE

(75) Inventor: Kazuki Ichikawa, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 10 days.

(21) Appl. No.: 11/097,241

(22) Filed: Apr. 4, 2005

(65) Prior Publication Data

US 2005/0166839 A1    Aug. 4, 2005

Related U.S. Application Data

(62) Division of application No. 10/458,383, filed on Jun. 11, 2003.

(30) Foreign Application Priority Data

Jun. 12, 2002  (JP) ............................. 2002-170894
Jun. 19, 2002  (JP) ............................. 2002-178116

(51) Int. Cl.
  *B05C 3/02*  (2006.01)
(52) U.S. Cl. ..................... 118/414; 118/258
(58) Field of Classification Search ............... 118/414, 118/244, 258, 249, 429, 248, 110, 117, 123, 118/126, 246, 247
See application file for complete search history.

(56) References Cited

U.S. PATENT DOCUMENTS 2,918,393 A * 12/1959 Wommack et al. ...... 427/428.2
3,496,012 A * 2/1970 Biorseth ..................... 427/345
4,518,637 A   5/1985 Takeda et al.
4,948,635 A * 8/1990 Iwasaki ..................... 427/345
5,306,523 A   4/1994 Shibata
5,582,870 A   12/1996 Shigesada et al.
5,735,957 A   4/1998 Becker et al.

FOREIGN PATENT DOCUMENTS

EP        0376207 A2    7/1990

\* cited by examiner

*Primary Examiner*—Brenda A. Lamb
(74) *Attorney, Agent, or Firm*—Sughrue Mion, PLLC

(57) ABSTRACT

A coating device is provided which has a bar which coats a coating liquid on a strip-shaped body conveyed in a given direction, and a dam-shaped member disposed at an upstream side of the bar so as to face the bar. Also provided is a coating method which, in the coating device, supplies the coating liquid from between the dam-shaped member and the bar so as to carry out coating. A flow rate of the coating liquid passing through a gap between the strip-shaped body and the dam-shaped member is set to be 3 m/min or more. A flow rate of the coating liquid passing through a gap between the bar and the dam-shaped member is set to be 5 mm/sec or more.

8 Claims, 3 Drawing Sheets

COATING DEVICE, AND COATING METHOD USING SAID DEVICE

This is a divisional of application Ser. No. 10/458,383 filed Jun. 11, 2003.

CROSS-REFERENCE TO RELATED APPLICATION

This application claims priority under 35 USC 119 from Japanese Patent Applications No. 2002-170894 and No. 2002-178116, the disclosure of which is incorporated by reference herein.

BACKGROUND OF THE INVENTION

1. Technical Field

The present invention relates to a coating device and a coating method. In particular, the present invention relates to a coating device and a coating method in which, even when coating a highly viscous coating liquid onto a strip-shaped body while conveying the strip-shaped body at high speed, local absence of the coating liquid due to the accompanying air which is brought in together with the strip-shaped body does not arise.

Moreover, the present invention relates to a coating device and a coating method in which, in a coating device which has a bar which coats a coating liquid on a strip-shaped body conveyed in a given direction and a dam-shaped member disposed at the upstream side of the bar, can effectively prevent problems at the coated surface which are caused by stuck matter which arises at the dam-shaped member at the upstream side.

2. Description of the Related Art

A planographic printing plate undergoes processes as follows to be fabricated. Commonly, at least one face of an aluminium web formed of pure aluminium or an aluminium alloy is dressed. Then an electrolytic oxidation layer is formed at that face as necessary, and thus a support web is formed. Next, a platemaking layer-forming liquid, such as a photosensitive layer formation solution, or a heat-sensitive layer formation solution, is coated onto a surface at the side of the support that has been dressed and is dried, and a photosensitive or heat-sensitive platemaking layer surface is formed.

Generally, a bar coater is employed for coating a coating liquid, such as a photosensitive layer formation solution, or a heat-sensitive layer formation solution, at a belt body, such as the aforementioned support web.

Conventionally, this bar coater is generally equipped with a bar and a coating section. While the bar is in contact with a lower surface of a continually running web, the bar rotates in a direction the same as the running direction of the web, or a direction opposite thereto. While the web is running, the coating section discharges the coating liquid at an upstream side from the bar, relative to the running direction of the web, and forms a coating liquid pool, thus coating the coating liquid onto the lower face of the web. The upstream side relative to the running direction of a web is hereafter referred to simply as "the upstream side".

The bar coater may be a bar coater disclosed in Utility Model Registration No. 2,054,836 includes a dam plate which is provided in proximity with a bar at the upstream side of the bar, and is formed such that thickness at an upper end portion thereof becomes thin toward a downstream side in the running direction of the web. The upper end portion of the dam plate curves toward the bar, and includes a flat face with a length of 0.1 to 1 mm at a peak portion thereof. Another bar coater may be one disclosed in Japanese Patent Application Publication (JP-B) No. 58-004589, which includes a first dam plate which is formed such that thickness at an upper end portion thereof becomes thinner toward a downstream side. This bar coater is also provided with a second dam plate at the downstream side of the bar. The downstream side in the running direction of a web is hereafter referred to simply as "the downstream side".

When the running speed of the support web becomes higher, an entrained air layer, which is a film of air that follows along and runs with the support web, that is, entrained air, is formed at the surface of the support web.

In either of the above-described bar coaters, when an entrained air layer is formed at the surface of the support web, the entrained air layer is carried into the coating liquid pool. As a result, the coating liquid is not applied to the surface of the support web uniformly, and coating of the coating liquid is not carried out stably, causing film discontinuities.

When the flow rate of the coating liquid which flows out from the gap between the bar and the dam plate is low, the flow of the coating liquid which overflows from the dam plate to the upstream side is intermittent, and is not uniform along the direction in which the dam plate extends, i.e., the widthwise direction of the strip-shaped body which is passing above the dam plate.

Accordingly, at the upstream side edge portion at the dam plate, the phenomenon of drying and sticking arises in which the coating liquid, which has adhered to the dam plate, dries out and sticks thereto. The stuck matter which arises due to this drying and sticking is a cause of various problems in surface quality at the coated surface on which the coating liquid is coated, such as coating streaks which are stripe-like defects, the adhesion of stuck matter in which the stuck matter comes off of the dam plate and adheres to the coated surface, and the like.

SUMMARY OF THE INVENTION

A object of the present invention is to provide a coating device and a coating method which can carry out stable coating without problems such as local absence of the coating liquid at a coated film or the like arising, even in cases in which coating is carried out while a strip-shaped body such as a support web or the like is traveling at a high speed of an extent such that an accompanying air film is formed on the surface.

In the present invention, stuck matter which sticks to the dam-shaped member does not arise even in cases in which the flow rate of the coating liquid discharged out from between the bar and the dam plate is low. Accordingly, another object of the present invention is to provide a coating device and a coating method in which problems with the surface quality, such as coating streaks or the like, do not arise.

A first aspect of the present invention is a coating device having a bar which coats a coating liquid on a strip-shaped body conveyed in a given direction, and a dam-shaped member disposed at an upstream side of the bar so as to face the bar. The coating device carries out coating by supplying the coating liquid from between the dam-shaped member and the bar. A flow rate of the coating liquid passing through a gap between the strip-shaped body and the dam-shaped member is set to be 3 m/min or more.

In this coating device, a portion of the coating liquid supplied from between the dam-shaped member and the bar toward the strip-shaped body is coated onto the strip-shaped body. The remainder of the coating liquid passes through the cap between the dam-shaped member and the strip-shaped body, and flows down toward the upstream side of the dam-shaped member.

The flow rate of the coating liquid flowing through the gap toward the upstream side is set to be 3 m/min or more. Therefore, the accompanying air, which is brought into the coating device together with the strip-shaped body, is pushed to return toward the upstream side, i.e., is eliminated. Accordingly, such accompanying air is not brought into the coating device.

Accordingly, even in cases in which the conveying speed of the strip-shaped body is raised, local absence of the coating liquid caused by accompanying air does not arise, and a uniform coated surface can be obtained.

The bar may be smooth bars with surfaces which are even. The bars may also be, for example, grooved bars in which circumferential direction grooves are formed, wire bars at whose surfaces metallic wires with diameters of around 0.1 mm are wound to a certain pitch or are tightly wound.

Belt bodies have continuous belt forms and include base materials having flexibility. Specific examples include, besides a support web mentioned above, base materials which are employed in photosensitive materials, magnetic recording materials. A base material may be, for example, the aforementioned support web, a base material for a photographic film, baryta paper for photographic printing paper, a base material for an audio recording tape, a base material for a video tape, or a base material for a floppy disk. Alternatively, metallic thin plates employed for coated metallic plates, such as a color steel sheet, can be used.

Besides a platemaking layer-forming liquid mentioned in the "Description of the Related Art", the coating liquid may be a photosensitive agent colloid solution employed for forming a photosensitive layer for silver salt photography, a magnetic layer formation solution employed in formation of a magnetic layer of the above-mentioned magnetic recording material, various coating materials employed for undercoat layers, intermediate coating layers, and overcoat layers of the above-mentioned coated metallic plates.

In the present invention, at the time of coating, the gap between the strip-shaped body and the dam-shaped member may be 0.1 to 3 mm.

In a coating device in which the gap is set in this way, even when the coating liquid is supplied at the usual liquid feed amount at a bar coater, local absence of the coating liquid caused by the bringing-in of accompanying air can be particularly effectively prevented because the flow rate of the coating liquid passing through the gap between the strip-shaped body and the dam-shaped member is set to 3 m/min or more.

In the present invention, a pressing roller, which presses the strip-shaped body toward the bar, may be provided at the upstream side of the dam-shaped member.

In a coating device provided with such a pushing roller, the size of the gap between the strip-shaped body and the dam-shaped member at the time of coating can be increased or decreased by increasing or decreasing the pressing force of the pressing roller. Thus, the gap can easily be controlled to a size corresponding to the supplied amount of the coating liquid.

In the present invention, the bar may be able to rotate at a circumferential speed which is different than the conveying speed of the strip-shaped body.

In a coating device having such a structure, a stable pool of the coating liquid is formed by the space between the strip-shaped body and the bar and the dam plate. Thus, the coating liquid can be coated even more uniformly and stably.

In the present invention, the bar may be able to rotate at a circumferential speed which is equal to the conveying speed of the strip-shaped body.

In a coating device having such a structure, the bar can be made to be slave-driven by the strip-shaped body. Thus, a bar driving device for rotating the bar can be omitted.

In the present invention, the bar may be able to rotate in a direction opposite to the conveying speed of the strip-shaped body.

In a coating device having such a structure, a stable pool of the coating liquid is formed by the space between the strip-shaped body and the bar and the dam plate. Thus, the coating liquid can be coated even more uniformly and stably.

A second aspect of the present invention is a coating method which coats a coating liquid onto a strip-shaped body conveyed in a given direction, by using a coating device having a bar which coats the coating liquid and a dam-shaped member which is disposed at an upstream side of the bar so as to face the bar. The coating method comprises the step of carrying out coating with a flow rate of the coating liquid passing through a gap between the strip-shaped body and the dam-shaped member being set to be 3 m/min or more.

In accordance with this coating method, for the same reasons as described above, even in cases in which the conveying speed of the strip-shaped body is raised, local absence of the coating liquid caused by accompanying air does not arise, and a uniform coated surface can be obtained.

A third aspect of the present invention is a coating device having a bar which coats a coating liquid on a strip-shaped body conveyed in a given direction, and an upstream side dam-shaped member disposed at an upstream side of the bar so as to face the bar. The coating device carries out coating by supplying the coating liquid from between the upstream side dam-shaped member and the bar. A flow rate of the coating liquid passing through a gap between the bar and the upstream side dam-shaped member is set to be 5 mm/sec or more.

In this coating device, the flow rate of the coating liquid passing through the gap between the upstream side dam-shaped member and the bar is set to be 5 mm/sec or more. Therefore, a uniform flow of coating liquid, which flows over the upstream side dam-shaped member toward the upstream side, is continuously formed.

Accordingly, no drying and sticking arises at the upstream side dam-shaped member. Therefore, the occurrence of problems in surface quality, which are caused by stuck matter which is formed due to this drying and sticking, is prevented.

A fourth aspect of the present invention is a coating device having a bar which coats a coating liquid on a strip-shaped body conveyed in a given direction, an upstream side dam-shaped member disposed at an upstream side of the bar so as to face the bar, and a downstream side dam-shaped member disposed at a downstream side of the bar so as to face the bar. The coating device carries out coating by supplying the coating liquid from between the upstream side dam-shaped member and the bar. A flow rate of the coating liquid both at a primary side clearance which is a gap between the bar and the upstream side dam-shaped member, and at a secondary side clearance which is a gap between the bar and the downstream side dam-shaped member, is set to be 5 mm/sec or more.

In this coating device, not only the flow rate of the coating liquid at the primary side clearance, but also the flow rate of the coating liquid at the secondary side clearance, is set to be 5 mm/sec or more. Thus, a uniform flow of the coating liquid is formed continuously at the downstream side dam-shaped member as well.

Accordingly, the occurrence of drying and sticking is prevented at the downstream side dam-shaped member as well. Therefore, in the present coating device, the occurrence of problems in surface quality, which are caused by this drying and sticking, is prevented even more effectively than in the coating device of the first aspect.

In the present invention, the gap between the bar and the upstream side dam-shaped member may be set to be 0.1 to 10 mm.

In a coating device in which setting is carried out in this way, even when the coating liquid is supplied at the usual liquid feed amount, the generation of stuck matter at the upstream side dam-shaped member and the downstream side dam-shaped member, and the occurrence of problems in surface quality accompanying such generation of stuck matter, can be effectively prevented because the coating liquid flows through the primary side clearance and the secondary side clearance at a flow rate of 5 mm/sec or more.

In this coating device, the upstream side dam-shaped member and the downstream side dam-shaped member may be fixed with respect to the bar. However, if the upstream side dam-shaped member and the downstream side dam-shaped member are formed so as to be able to approach and move away from the bar, by moving the upstream side dam-shaped member and the downstream side dam-shaped member, the primary side clearance and the secondary side clearance can be enlarged when the discharged amount of the coating liquid is high, and the primary side clearance and the secondary side clearance can be reduced when the discharged amount of the coating liquid is small. Accordingly, in this coating device, regardless of the discharged amount of the coating liquid, it is easy to maintain the flow rate of the coating liquid at 5 mm/sec or more at the primary side clearance and the secondary side clearance.

In the third and fourth aspects of the present invention, the bar may be able to rotate at a circumferential speed which is equal to the conveying speed of the strip-shaped body.

In a coating device in which setting is carried out in this way, the bar can be made to be slave-driven by the strip-shaped body. Thus, a bar driving device for rotating the bar can be omitted.

In the third and fourth aspects of the present invention, the bar may be able to rotate at a circumferential speed which is different than the conveying speed of the strip-shaped body.

In a coating device in which setting is carried out in this way, a stable pool of the coating liquid is formed by the space between the strip-shaped body and the bar and the dam plate. Thus, a coated film which is even more uniform is formed.

In the third and fourth aspects of the present invention, the bar may be able to rotate in a direction opposite to the conveying speed of the strip-shaped body.

In a coating device in which setting is carried out in this way, a stable pool of the coating liquid is formed. Thus, a coated film which is even more uniform is formed.

A fifth aspect of the present invention is a coating method which coats a coating liquid onto a strip-shaped body conveyed in a given direction, by using a coating device having a bar which coats the coating liquid and an upstream side dam-shaped member which is disposed at an upstream side of the bar so as to face the bar. The coating method comprises the step of carrying out coating with a flow rate of the coating liquid passing through a gap between the bar and the upstream side dam-shaped member being set to be 5 mm/sec or more.

For the same reasons as described in connection with the third aspect of the present invention, in accordance with this coating method, it is possible to prevent stuck matter from arising at the top portion of the upstream side dam-shaped member, and prevent the occurrence of problems in surface quality caused by such stuck matter at the coated surface of the strip-shaped body.

DETAILED DESCRIPTION OF THE EMBODIMENT

Figure 1:
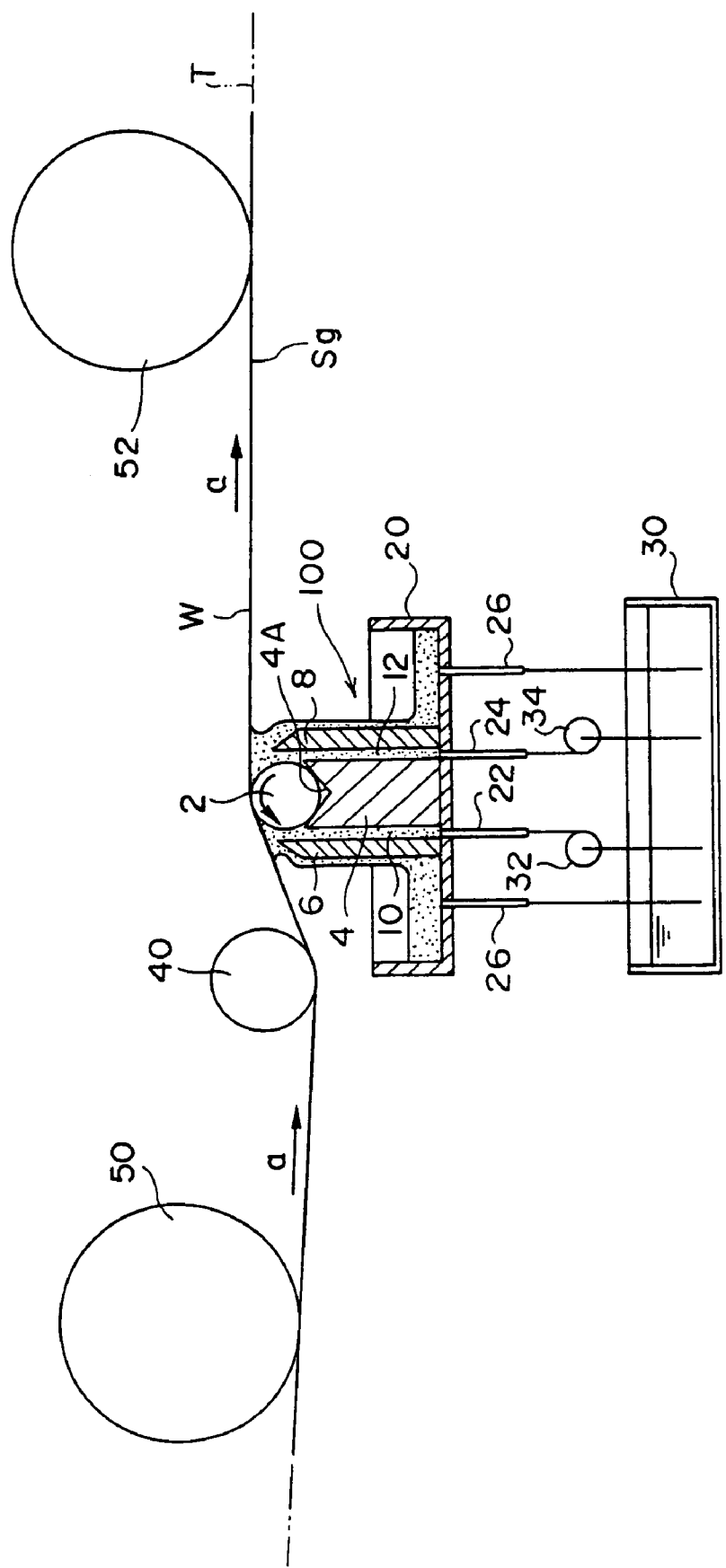
FIG. 1 is a schematic diagram showing the structure of one example of a coating device relating to the present invention.
Figure 2:
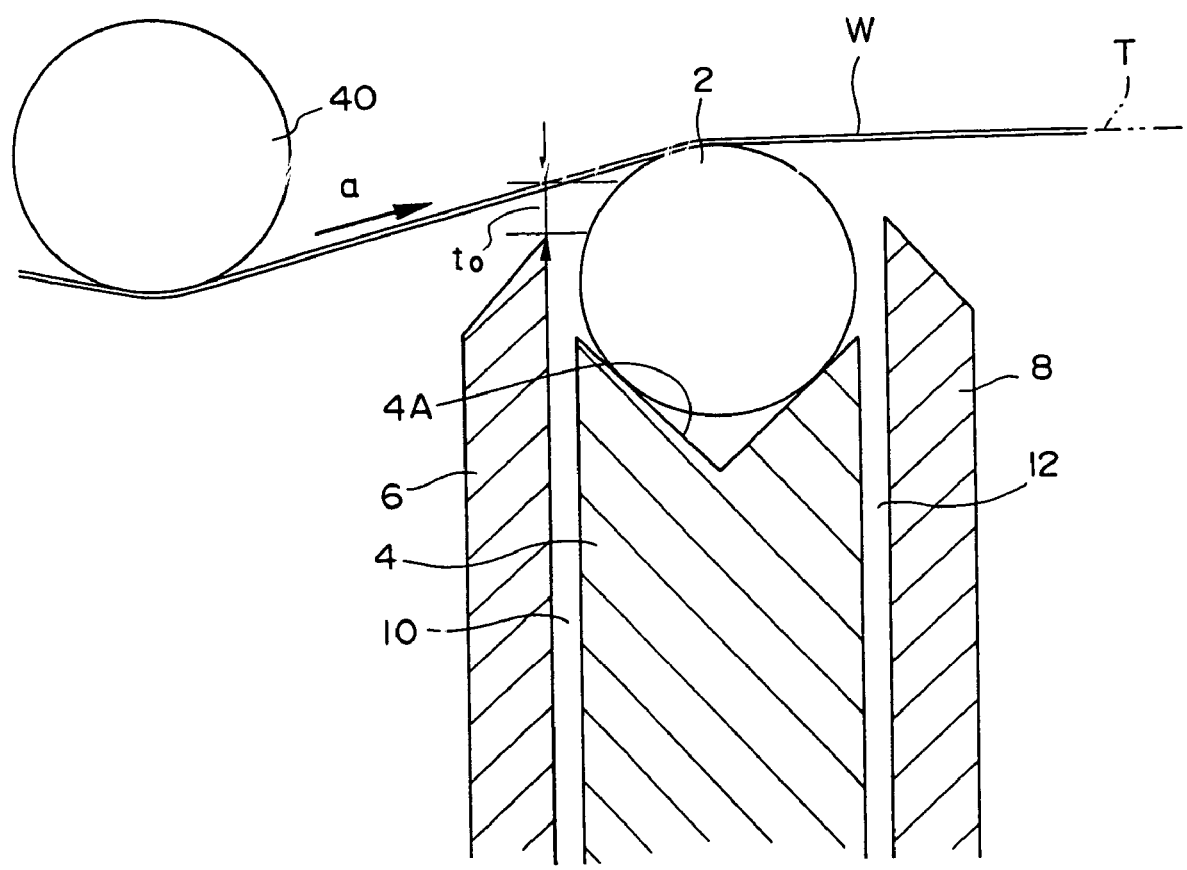
FIG. 2 is an enlarged view showing the structure of a vicinity of a bar in the coating device shown in FIG. 1, and showing an interval between a strip-shape body and a dam-shaped member.

The basic structure of one example of the coating device relating to the present invention is shown in FIG. 1. The structure of the vicinity of a bar in the coating device is shown in FIG. 2.

A coating device 100 relating to the present embodiment is a coating device which coats a liquid for forming a plate-making layer on a roughened surface Sg of a support web W which travels continuously along the direction of arrow a in FIG. 1. The support web W is one example of the strip-shaped body in the present invention. The liquid for forming a plate-making layer is one example of the coating liquid in the present invention.

As shown in FIG. 1, the coating device 100 has, beneath a conveying plane T which is a conveying path of the support web W, a bar 2 which is disposed orthogonal with respect to the traveling direction of the support web W, and a supporting stand 4 which is a plate-shaped member which supports the bar 2 from beneath. At the upstream side, in the traveling direction a, of the supporting stand 4 and the bar 2, the coating device 100 has an upstream side dam-shaped member 6 which is provided parallel to the bar 2 and so as to oppose the bar 2 and the supporting stand 4. Moreover, at the downstream side, in the traveling direction a, of the supporting stand 4 and the bar 2, the coating device 100 has a downstream side dam-shaped member 8 which is provided parallel to the bar 2 and so as to oppose the bar 2 and the supporting stand 4. The upstream side dam-shaped member 6 corresponds to the dam-shaped member in the coating device of the present invention. A V-shaped bar holding groove 4A, which holds the bar 2, is provided in the top surface of the supporting stand 4, at which top surface the bar 2 is held. The dam-shaped members 6, 8 may be plates.

The distance between the upstream side dam-shaped member 6 and the bar 2 may be about 0.1 mm to 3 mm.

Further, as shown in FIG. 2, the interval between the support web W and the upstream side dam-shaped member 6 may be adjusted such that the size of the gap $t_0$ between the top end of the upstream side dam-shaped member 6 and the support web W is in the range of 0.1 mm to 3 mm, and in particular, is in the range of 0.3 mm to 1 mm.

Figure 3:
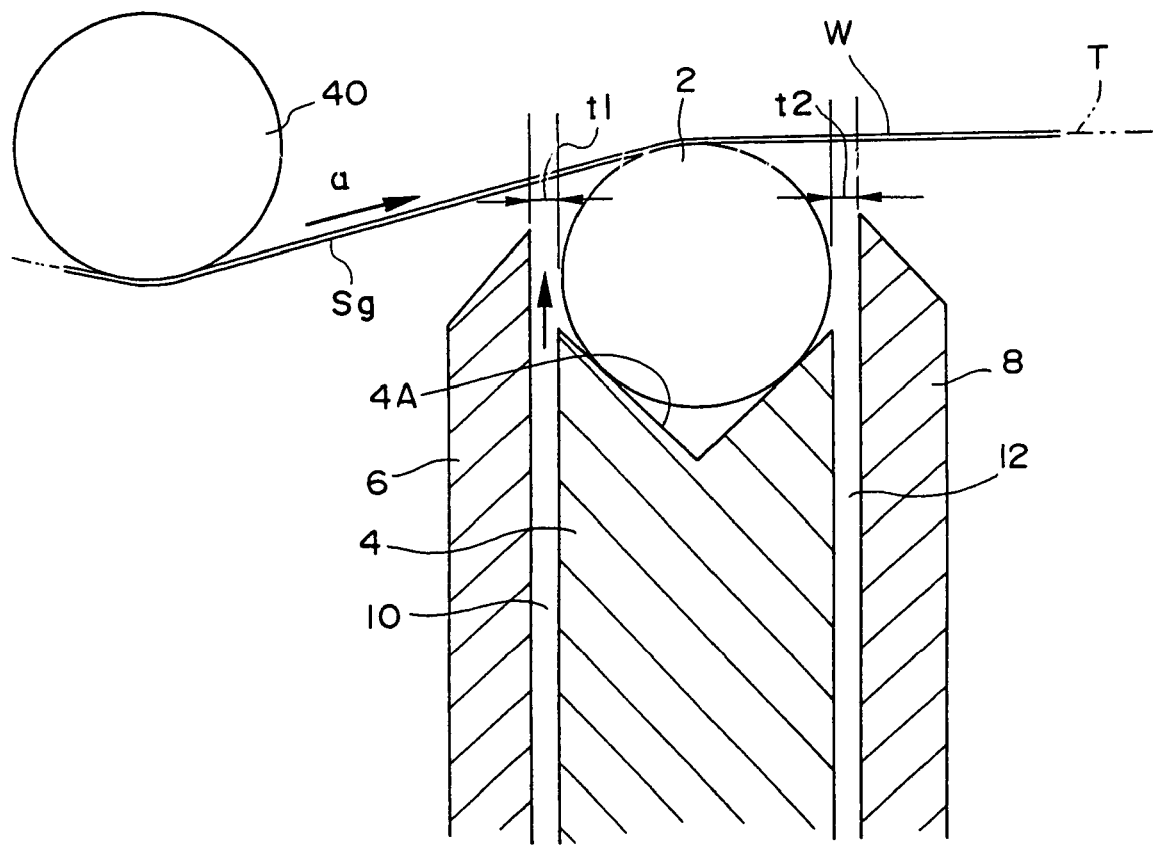
FIG. 3 is an enlarged view showing the structure of the vicinity of the bar in the coating device shown in FIG. 1, and showing an interval between the dam-shaped member and the bar.

As shown in FIG. 3, the size of the interval between the upstream side dam-shaped member 6 and the bar 2, i.e., a primary side clearance t1, and the interval between the downstream side dam-shaped member 8 and the bar 2, i.e., a secondary side clearance t2, may each be set to be about 0.1 mm to 10 mm. Note that both the upstream side dam-shaped member 6 and the downstream side dam-shaped member 8 may be formed such that the distance between the supporting stand 4 and the upstream side dam-shaped member 6 and the distance between the supporting stand 4 and the downstream side dam-shaped member 8 can be adjusted.

An upstream side coating liquid supplying flow path 10, which supplies the liquid for forming a plate-making layer to the upstream side of the bar 2, is provided between the supporting stand 4 and the upstream side dam-shaped member 6. A downstream side coating liquid supplying flow path 12, which supplies the liquid for forming a plate-making layer to the downstream side of the bar 2, is provided between the supporting stand 4 and the downstream side dam-shaped member 8.

The upstream side dam-shaped member 6, the supporting stand 4, and the downstream side dam-shaped member 8 are supported from beneath by a base 20 which can be raised and lowered. The base 20 is formed as a shallow box whose top surface is open, so as to be able to receive and recover the liquid for forming a plate-making layer which crosses over the upstream side dam-shaped member 6 and the downstream side dam-shaped member 8 and flows down. The base 20 has, at the bottom surface thereof, an upstream side liquid supplying conduit 22 which supplies the liquid for forming a plate-making layer to the upstream side coating liquid supplying flow path 10, a downstream side liquid supplying conduit 24 which supplies the liquid for forming a plate-making layer to the downstream side coating liquid supplying flow path 12, and a coating liquid recovery conduit 26 which recovers the liquid for forming a plate-making layer received in the base 20. The upstream side liquid supplying conduit 22, the downstream side liquid supplying conduit 24, and the coating liquid recovery conduit 26 are all connected to a coating liquid storing tank 30 in which the liquid for forming a plate-making layer is stored.

An upstream side liquid supplying pump 32, which supplies the liquid for forming a plate-making layer which is stored in the coating liquid storing tank 30 to the upstream side coating liquid supplying flow path 10, is provided at the upstream side liquid supplying conduit 22. A downstream side liquid supplying pump 34, which supplies the liquid for forming a plate-making layer to the downstream side coating liquid supplying flow path 12, is provided at the downstream side liquid supplying conduit 24.

A pressing roller 40 is provided at the upstream side of the upstream side dam-shaped member 6. The pressing roller 40 abuts, from above, the upper surface of the support web W, i.e., the surface at the side opposite the roughened surface Sg, and presses the support web W downward, i.e., toward the bar 2. By increasing and decreasing the pressing force by which the pressing roller 40 presses the support web W, the size of the gap $t_0$ between the support web W and the upstream side dam-shaped member 6 can be increased and decreased.

Web holding rollers 50 and 52, which abut the top surface of the support web W and hold the support web W such that the support web W is conveyed along the conveying path T, are disposed at the upstream side and downstream side of the coating device 100.

Any of smooth bar, grooved bar, and wire bar can be used as the bar 2. As shown in FIG. 1, the coating bar may be driven in the direction opposite to the traveling direction a of the support web W. Or, the coating bar may be driven in the same direction as the traveling direction a, or may be slave-rotated.

As shown in FIGS. 1 through 3, the upstream side surface of the upstream side dam-shaped member 6 is bent, at the upper end portion thereof, toward the downstream side. The downstream side surface is formed in a vertical plane shape. Thus, the top end portion of the upstream side dam-shaped member 6 is formed on the whole as a wedge shape whose thickness decreases toward the top.

The upstream side surface of the downstream side dam-shaped member 8 is formed in a vertical plane shape. The downstream side surface is bent, at the upper end portion thereof, toward the downstream side. Thus, the top end portion of the downstream side dam-shaped member 8 is formed on the whole as a wedge shape whose thickness decreases toward the top.

At the coating device 100, the liquid for forming a plate-making layer, which is stored in the coating liquid storing tank 30, is supplied through the upstream side liquid supplying conduit 22 to the upstream side coating liquid supplying flow path 10, and is supplied to the space formed by the support web W and the bar 2 and the upstream side dam-shaped member 6.

A portion of the liquid for forming a plate-making layer which is supplied to this space is adhered to the roughened surface of the support web W by the bar 2. The remainder of the liquid for forming a plate-making layer flows out to the upstream side from the gap $t_0$ between the support web W and the top portion of the upstream side dam-shaped member 6, flows along the upstream side surface of the upstream side dam-shaped member 6, and flows down into the base 20.

The liquid for forming a plate-making layer, which is supplied to the upstream side coating liquid supplying flow path 10, passes through the primary side clearance t1, and is supplied to the pool of coating liquid formed by the support web W and the bar 2 and the upstream side dam-shaped member 6.

The liquid for forming a plate-making layer, which is supplied to the downstream side coating liquid supplying flow path 12, passes through the secondary side clearance t2, is supplied to the downstream side at the bar 2, overflows to the downstream side along the top surface of the downstream side dam-shaped member 8, and flows down onto the base 20.

The liquid for forming a plate-making layer, which flows down into the base 20, returns to the coating liquid storing tank 30 through the coating liquid recovery conduit 26.

Here, given that the amount of the coating liquid supplied at the upstream side liquid supplying pump 32 is S, the size of the gap $t_0$ is $t_0$, the flow rate of the liquid for forming a plate-making layer at the gap $t_o$ is V, and the liquid feed width by which the liquid for forming a plate-making layer is fed toward the gap from the upstream side coating liquid supplying flow path 10 is w, the relationship.

$$V = S/(t_0 \cdot w)$$

is established among S, $t_o$, V and w. Further, the liquid feed amount S can be determined by a flow meter provided at the exit side of the upstream side liquid supplying pump 32. The size of the gap $t_0$ can be determined by raising the base 20 up to the height at the time of carrying out coating of the liquid for forming a plate-making layer, and inserting clearance gauges of various thicknesses into the gap $t_0$. Moreover, the liquid feed width w can be determined by measuring, by a scale or a tape measure or the like, the width by which the liquid for forming a plate-making layer flows out from between the bar 2 and the upstream side dam-shaped member 6.

When the flow rate V is set to 3 m/min or more by adjusting the size of the gap $t_0$ by raising or lowering the pressing bar 40, or by controlling the liquid feed amount S by raising or lowering the rotational speed of the upstream side liquid supplying pump 32 or the degree of opening of a throttle valve (not illustrated) provided at the exit side thereof, the accompanying air which is brought into the coating device 100 by the support web T is pushed out to return to the upstream side by the flow of the liquid for forming a plate-making layer which passes through the gap $t_0$.

Accordingly, even in cases in which the support web W is conveyed at a high speed, the accompanying air at the surface of the support web W is eliminated. Thus, defects such as local absence of the coating liquid or the like at the coated film can effectively be prevented from arising.

Given that the liquid feed amount of the upstream side liquid supplying pump 32 is S1, the liquid feed amount of the downstream side liquid supplying pump 34 is S2, the flow rate of the liquid for forming a plate-making layer at the primary side clearance t1 is V1, the flow rate of the liquid for forming a plate-making layer at the secondary side clearance t2 is v2, and the liquid feed width by which the liquid for forming a plate-making layer is fed at the upstream side coating liquid supplying flow path 10 and the downstream side coating liquid supplying flow path 12 is w, the following relationships are established among S1, S2, t1, t2, v1, v2 and w:

$$v1 = S1/t1 \cdot w \quad (1)$$

$$v2 = S2/t2 \cdot w \quad (2)$$

Further, the liquid feed amount S1 and the liquid feed amount S2 can be determined by flow meters provided at the exit sides of the upstream side liquid supplying pump 32 and the downstream side liquid supplying pump 34. The thicknesses of the primary side clearance t1 and the secondary side clearance t2 can be determined by inserting clearance gauges of various thicknesses between the bar 2 and the upstream side dam-shaped member 6, and between the bar 2 and the downstream side dam-shaped member 8. Moreover, the liquid feed width w can be determined by measuring, by a scale or a tape measure or the like, the width by which the liquid for forming a plate-making layer flows out from between, on the one hand, the bar 2 and, on the other hand, the upstream side dam-shaped member 6 and the downstream side dam-shaped member 8.

When the flow rates v1 and v2 are set to 5 mm/sec or more by adjusting the thicknesses of the primary side clearance t1 and the secondary side clearance t2 by making the upstream side dam-shaped member 6 and the downstream side dam-shaped member 8 approach or move away from the support stand 4, or by controlling the liquid feed amounts S1 and S2 by increasing or reducing the rotational speeds of the upstream side liquid supplying pump 32 and the downstream side liquid supplying pump 34 or the degrees of opening of the throttle valves (not illustrated) provided at their exit sides, a uniform and continuous flow of the liquid for forming a plate-making layer is formed at both the upstream side dam-shaped member 6 and the downstream side dam-shaped member 8.

Accordingly, it is possible to effectively prevent the liquid for forming a plate-making layer from sticking to the top surfaces of the upstream side dam-shaped member 6 and the downstream side dam-shaped member 8 such that stuck matter arises and the stuck matter adheres to the coated surface such that various problems in the surface quality (such as coating streaks or the like) arise.

COMPARATIVE EXAMINATION EXAMPLE A (Examples 1 through 3, Comparative Examples 1 and 2)

One surface of an aluminum web of a width of 800 mm was roughened by being successively subjected to brush grain processing, alkali etching processing and electrolytic surface roughening. The one surface was then subjected to an anodizing treatment such that the support web was formed.

By using the coating device shown in FIG. 1, a liquid for forming a photosensitive layer, which served as a liquid for forming a plate-making layer, was coated on the roughened surface Sg of the support web, and was dried such that a photosensitive layer was formed. The conditions for coating the photosensitive layer coating liquid were as follows. Note that, in the present examples and comparative examples, the flow rate V, of the liquid for forming a photosensitive layer, at the gap t was set by setting the liquid feed amount S of the liquid for forming a photosensitive layer. The size of the gap t was measured by raising the base 20 to the height at the time of coating the liquid for forming a photosensitive layer, and inserting clearance gauges of various thicknesses between the upstream side dam-shaped member 6 and the support web W. The size of the gap t1 was measured by inserting clearance gauges of various thicknesses between the bar 2 and the upstream side dam-shaped member 6.

| | | |
|---|---|---|
| a. | thickness of support web W | 0.3 mm |
| b. | conveying speed of support web W | 50 m/min |
| c. | bar coating amount (amount coated onto support web W by bar 2) | 20 cc/m² |
| d. | outer diameter of bar 2 | 10 mm |
| e. | rotational speed of bar 2 | −50 rpm (reverse rotation) |
| f. | viscosity of liquid for forming a photosensitive layer | 1 mBa |
| g. | liquid feed amount S1 | 1.5 liters/min |
| h. | liquid feed width w | 1000 mm |
| i. | outer diameters of pressing rollers 50 and 52 | 50 mm |
| j. | size of primary side clearance $t_1$ | 5.0 mm |

The results are shown in Table 1. In Table 1 and other tables to be presented later, "OK" denotes that the occurrence of local absence of the coating liquid at the coated surface was not observed, and there is no problem in surface quality. The sign "SOME" denoted that the surface quality was not good to some extent. The sign "×" denotes that the occurrence of local absence of the coating liquid was clearly observed. The sign "C. Ex." means comparative example while the sign "Ex." means example. "Coated surface quality" also stands for the evaluation of coating performance of an example or a comparative example.

TABLE 1

|  | flow rate $v_1$ at primary side clearance $t_1$ | drying and sticking of liquid for forming a photosensitive layer on primary side dam plate | Coated surface quality |
| --- | --- | --- | --- |
| C. Ex. 1 | 3.0 mm/sec | x | x (i) |
| C. Ex. 2 | 4.0 mm/sec | SOME | x (ii) |
| Ex. 1 | 5.0 mm/sec | OK | OK |
| Ex. 2 | 8.0 mm/sec | OK | OK |
| Ex. 3 | 10.0 mm/sec | OK | OK |

(i) occurrence of coating streaks/adhesion of stuck matter onto support web.
(ii) occurrence of coating streaks/adhesion of stuck matter onto support web As is shown in Table 1, in Examples 1 through 3 in which the flow rate $v_1$, of the liquid for forming a photosensitive material, at the primary side clearance $t_1$ was 5 mm/sec or more, neither the generation of stuck matter at the upstream side dam-shaped member 6, nor problems in surface quality due to the stuck matter adhering to the coated surface of the liquid for forming a photosensitive layer were observed. In Comparative Examples 3 and 4 in which the flow rate $v_1$ was less than 5 mm/sec, both the generation of stuck matter and problems in surface quality were observed.

COMPARATIVE EXAMINATION EXAMPLE B (Examples 4 through 8, Comparative Examples 3 through 6)

One surface of an aluminum web of a width of 800 mm was roughened according to the same procedures of the examples 1 through 3. The one surface was then subjected to an anodizing treatment such that the support web was formed.

By using the coating device shown in FIG. 1, a liquid for forming a photosensitive layer, which served as a liquid for forming a plate-making layer, was coated on the roughened surface Sg of the support web, and was dried such that a photosensitive layer was formed. The conditions for coating the photosensitive layer coating liquid were as follows. Note that, in the present Examples and Comparative Examples, the flow rate V, of the liquid for forming a photosensitive layer, at the gap t was set by setting the liquid feed amount S of the liquid for forming a photosensitive layer. Further, the size of the gap t was measured by raising the base 20 to the height at the time of coating the liquid for forming a photosensitive layer, and inserting clearance gauges of various thicknesses between the upstream side dam-shaped member 6 and the support web W. Further, the size of the gap t was measured by inserting clearance gauges of various thicknesses between the bar 2 and the upstream side dam-shaped member 6.

| a. | thickness of support web W | 0.1–0.5 mm |
| --- | --- | --- |
| b. | conveying speed of support web W | 50 m/min–200 m/min |
| c. | bar coating amount (amount coated onto support web W by bar 2) | 20 cc/m² |
| d. | outer diameter of bar 2 | 10 mm, 15 mm |
| e. | rotational speed of bar 2 | –50 rpm (reverse rotation) |

-continued

| f. | viscosity of liquid for forming a photosensitive layer | 10 mBa |
| --- | --- | --- |
| g. | outer diameter of pressing roller 40 | 50 mm |
| h. | distance between central lines of pressing roller 40 and bar 2 | 30 mm |
| i. | liquid feed amount S | 1.0 to 10 liters/min |
| j. | liquid feed width w | 1000 mm |
| k. | size of gap t | 0.5 mm |

The relationship between the liquid feed amount S and the liquid feed width w and the gap t was as per following Table 2.

TABLE 2

| Gap t = 0.5 mm and Liquid Feed Width w = 1000 mm | |
| --- | --- |
| S (liters/min) | V (m/min) |
| 1 | 2 |
| 1.5 | 3 |
| 5 | 10 |
| 10 | 20 |

The surface texture of the roughened surface of the support web was 0.5 μm according the following measurement. The photosensitive layer formed by the above procedure was removed from the support web. The central portion of the support web was cut into an appropriate size as a specimen. The cut central portion was then placed on a platen of a surface texture measuring instrument in a state that the measuring direction is perpendicular to the rolling direction of aluminum. A 24-mm distance was measured once to show a result in μm. The instrument was the model code 113B made by Tokyo Seimitsu Co., Ltd.

Results of forming a photosensitive layer were tabulated into Table 3 as follows.

TABLE 3

|  | Flow rate between dam plates 6 (m/min) | Volume of supplied liquid (l/min) | Conveying speed (m/min) | Coated surface quality |
| --- | --- | --- | --- | --- |
| C. Ex. 3 | 2.0 | 1.0 | 50 | OK |
| C. Ex. 4 | 2.0 | 1.0 | 100 | x |
| C. Ex. 5 | 2.0 | 1.0 | 100–200 | x |
| Ex. 4 | 3.0 | 1.5 | 100 | OK |
| Ex. 5 | 5.0 | 1.5 | 100 | OK |
| Ex. 6 | 10.0 | 5.0 | 100 | OK |
| Ex. 7 | 15.0 | 7.5 | 150 | OK |
| Ex. 8 | 20.0 | 10.0 | 150 | OK |
| Ex. 9 | 3.0 | 1.5 | 100–200 | OK |
| Ex. 10 | 5.0 | 2.5 | 100–200 | OK |
| Ex. 11 | 10.0 | 5.0 | 100–200 | OK |
| Ex. 12 | 15.0 | 7.5 | 100–200 | OK |
| Ex. 13 | 20.0 | 10.0 | 100–200 | OK |

As shown in Table 3, in the comparative example 3 in which the flow rate v, of the liquid for forming a photosensitive material, was 2 m/min and conveying speed was 50 m/min, interruption of liquid did not occur, and stable coating was performed. In both of the comparative example 4 in which the conveying speed was 100 m/min, and the comparative example 5 in which the conveying speed was changed in the range from 100 m/min to 200 m/min, the interruption of liquid was observed respectively. In the examples 4 through 13 in which the flow rate was equal to or faster than 3 m/min respectively, no interruption of liquid did occur when the conveying speed was 100 m/min or 150 m/min or even changed in the range from 100 m/min to 200 m/min. Thus, stable coating was performed.

COMPARATIVE EXAMINATION EXAMPLE C (Examples 9 through 13, Comparative Examples 6 and 7)

Surface roughness was changed in the range from 0.2 to 0.9. Other conditions to prepare support webs, coat and dry coating liquid for forming a photosensitive layer are the same with those of the examples 4 through 13 and the comparative examples 13 through 5. The results are tabulated in Table 4 below.

TABLE 4

|  | Flow rate between dam plates 6 (m/min) | Volume of supplied liquid (l/mm) | Surface Texture (μm) | Conveying speed (m/min) | Coated surface quality |
|---|---|---|---|---|---|
| C. Ex. 6 | 2.0 | 1.0 | 0.2 | 100–200 | OK |
| C. Ex. 7 | 2.0 | 1.0 | 0.5 | 100–200 | x |
| Ex. 9 | 3.0 | 1.5 | 0.5 | 100–200 | OK |
| Ex. 10 | 3.0 | 1.5 | 0.7 | 100–200 | OK |
| Ex. 11 | 10.0 | 5.0 | 0.9 | 100–200 | OK |
| Ex. 12 | 20.0 | 10.0 | 0.9 | 100–200 | OK |
| Ex. 13 | 20.0 | 10.0 | 0.9 | 100–200 | OK |

As shown in Table 4, in the cases where the flow rate was 2 m/min of the liquid for forming a photosensitive layer, the comparative example 6 whose surface roughness of the support web was 0.2 and which is relatively smoother obtained a well-coated surface. In the comparative example 7 in which surface roughness was 0.5, local absence of coating liquid was clearly observed.

In contrast, in the examples 14 through 18 where the flow rate of the coating liquid was equal to or faster than 3 m/min, good quality in a respective coated surface was obtained.

COMPARATIVE EXAMINATION EXAMPLE D (Examples 14 through 16, Comparative Examples 8 through 1-10)

Viscosity of the liquid for forming a photosensitive layer was changed in the range from 0.5 to 50 mPa·s. Other conditions to prepare support webs, coat and dry coating liquid for forming a photosensitive layer are the same with those of the examples 4 through 13 and the comparative examples 13 through 5. The results are tabulated in Table 5 below.

TABLE 5

|  | Flow rate between dam plates 6 (m/min) | Volume of supplied liquid (l/mm) | Viscosity (mPa · s) | Conveying speed (m/min) | Coated surface quality |
|---|---|---|---|---|---|
| C. Ex. 8 | 2.0 | 1.0 | 0.5–5.0 | 100–200 | OK |
| C. Ex. 9 | 2.0 | 1.0 | 5.0–30 | 100–200 | SOME |
| C. Ex. 10 | 2.0 | 1.0 | 30–50 | 100–200 | x |
| Ex. 14 | 3.0 | 1.0 | 5.0–50 | 100–200 | OK |
| Ex. 15 | 10.0 | 5.0 | 5.0–50 | 100–200 | OK |
| Ex. 16 | 20. | 10.0 | 5.0–50 | 100–200 | OK |

As shown in Table 5, among the comparative examples 8 through 10 whose flow rate was 2 m/min respectively, the comparative example 8 where a relatively low-viscous coating liquid in the range from 0.5 mPa·s to 5.0 mPa·s was used obtained a well-coated surface quality. As the viscosity increased, local absence of the coating liquid was likely to be observed. In the comparative example 10 whose viscosity was in the range from 30 mPa·s to 50 mPa·s, local absence of the coating liquid was clearly observed.

In contrast, in the examples 19 through 21 whose flow rate of the liquid for forming a photosensitive layer was equal to or faster than 3 m/min, good quality in a coated surface was respectively obtained where the viscosity was in the range from 0.5 mpa·s to 5.0 mpa·s.

COMPARATIVE EXAMINATION EXAMPLE E (Examples 17 through 21, Comparative Examples 11 through 13)

The frequency of rotation of the bar was changed in this examination. Other conditions to prepare support webs, coat and dry coating liquid for forming a photosensitive layer are the same with those of the examples 4 through 13 and the comparative examples 13 through 5. The results are tabulated in Table 6 below.

TABLE 6

|  | Flow rate between dam plates 6 (m/min) | Volume of supplied liquid (l/mm) | Frequency of bar rotation (rpm) | Conveying speed (m/min) | Coated surface quality |
|---|---|---|---|---|---|
| C. Ex. 11 | 2.0 | 1.0 | +1,590 | 100~200 | OK |
| C. Ex. 12 | 2.0 | 1.0 | +700~+6,360 | 100~200 | x |
| C. Ex. 13 | 2.0 | 1.0 | −500~−2, +2~+500 | 100~200 | SOME |
| Ex. 17 | 3.0 | 1.5 | −500~−2, +2~+500 | 100~200 | OK |
| Ex. 18 | 3.0 | 1.5 | −500~−2, +2~+500 | 100~200 | Excellent |
| Ex. 19 | 3.0 | 1.5 | −10~−2, +2~+10 | 100~200 | Excellent |
| Ex. 20 | 10.0 | 5.0 | −500~−2, +2~+500 | 100~200 | OK |
| Ex. 21 | 20.0 | 10.0 | −500~−2, +2~+500 | 100~200 | OK |

Note:
"+2" = the rotation of 2 rpm in the support web conveying direction
"−2" = the rotation of 2 rpm against the support web conveying direction As shown in Table 6, among the comparative examples 11 through 13 whose respective flow rate was 2 m/min, the comparative example 11 where the frequency of rotation of the bar was set to be +1,590 rpm obtained a well-coated surface. In the comparative example 12 where the frequency of rotation of the bar was changed in the range from +700 rpm to +6,360 rpm, local absence of the coating liquid was clearly observed. Also in the comparative example 13 where the frequency of rotation of the bar was changed in the range from −2 rpm to −500 rpm and +2 rpm to +500 rpm, good quality in a coated surface was not obtained.

In contrast, in the examples whose respective flow rate was 2 m/min, good or excellent quality in a coated surface was obtained respectively where the frequency of rotation was in the ranges from −500 to −2 rpm and from +2 to +500 rpm.

As described above, in accordance with the present invention, there are provided a coating device and a coating method which, even when coating is carried out while a strip-shaped body is traveling at high speed, can carry out stable coating in which defects such as local absence of the coating liquid at the coated film or the like do not arise.

In accordance with the present invention, drying and sticking does not occur at the dam-shaped member. Accordingly, a coating device and a coating method, in which problems in surface quality do not arise, are provided.

What is claimed is:

1. A coating device comprising:
   a bar which coats a coating liquid on a strip-shaped body conveyed in a given direction,
   an upstream side dam-shaped member disposed at an upstream side of the bar so as to face the bar, the coating device carrying out coating by supplying the coating liquid from between the upstream side dam-shaped member and the bar,
   means for setting a flow rate of the coating liquid passing through a gap between the bar and the upstream side dam-shaped member to be 5 mm/sec or more, and
   a downstream side dam-shaped member disposed at a downstream side of the bar so as to face the bar,
   wherein the flow rate of the coating liquid both at a primary side clearance which is the gap between the bar and the upstream side dam-shaped member, and at a secondary side clearance which is a gap between the bar and the downstream side dam-shaped member, is set to be 5 mm/sec or more.

2. The coating device of claim 1, wherein the gap between the bar and the upstream side dam-shaped member is a value in a range of greater than 0.1 mm and less than 10 mm.

3. The coating device of claim 1, wherein the bar rotates at a circumferential speed which is equal to a conveying speed of the strip-shaped body.

4. The coating device of claim 1, wherein the bar rotates at a circumferential speed which different than a conveying speed of the strip-shaped body.

5. The coating device of claim 4, wherein the bar rotates in a direction opposite to the conveyed direction of the strip-shaped body.

6. The coating device of claim 1, wherein each of the upstream and downstream dam-shaped members is a rectangular plate.

7. The coating device of claim 1, wherein the strip-shaped body is a flexible base material.

8. The coating device of claim 1, further comprising a base which supports the dam-shaped members from beneath, and the base is box-shaped.

* * * * *